United States Patent
Booth, Jr. et al.

(10) Patent No.: US 10,818,668 B2
(45) Date of Patent: *Oct. 27, 2020

(54) METAL TRENCH CAPACITOR AND IMPROVED ISOLATION AND METHODS OF MANUFACTURE

(71) Applicant: INTERNATIONAL BUSINESS MACHINES CORPORATION, Armonk, NY (US)

(72) Inventors: Roger A. Booth, Jr., Irvine, CA (US); Kangguo Cheng, Schenectady, NY (US); Joseph Ervin, Wappingers Falls, NY (US); Chengwen Pei, Danbury, CT (US); Ravi M. Todi, San Diego, CA (US); Geng Wang, Stormville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 107 days.

This patent is subject to a terminal disclaimer.

(21) Appl. No.: 15/825,961

(22) Filed: Nov. 29, 2017

(65) Prior Publication Data

US 2018/0083009 A1 Mar. 22, 2018

Related U.S. Application Data

(60) Continuation of application No. 15/400,055, filed on Jan. 6, 2017, now Pat. No. 9,899,391, which is a (Continued)

(51) Int. Cl.
*H01L 27/108* (2006.01)
*H01L 49/02* (2006.01)
(Continued)

(52) U.S. Cl.
CPC ...... *H01L 27/10829* (2013.01); *H01L 21/743* (2013.01); *H01L 21/76283* (2013.01); (Continued)

(58) Field of Classification Search
CPC .......... H01L 27/10829; H01L 27/1087; H01L 28/60; H01L 27/108; H01L 27/1203; (Continued)

(56) References Cited

U.S. PATENT DOCUMENTS

| 4,959,709 A | 9/1990 | Watanabe |
|---|---|---|
| 5,843,820 A | 12/1998 | Lu |

(Continued)

FOREIGN PATENT DOCUMENTS

JP         8088332         4/1996

*Primary Examiner* — Stephen W Smoot
*Assistant Examiner* — Sun Mi Kim King
(74) *Attorney, Agent, or Firm* — Steven Meyers; Andrew M. Calderon; Roberts Calderon Safran & Cole, P.C.

(57) ABSTRACT

A high-k dielectric metal trench capacitor and improved isolation and methods of manufacturing the same is provided. The method includes forming at least one deep trench in a substrate, and filling the deep trench with sacrificial fill material and a poly material. The method further includes continuing with CMOS processes, comprising forming at least one transistor and back end of line (BEOL) layer. The method further includes removing the sacrificial fill material from the deep trenches to expose sidewalls, and forming a capacitor plate on the exposed sidewalls of the deep trench. The method further includes lining the capacitor plate with a high-k dielectric material and filling remaining portions of the deep trench with a metal material, over the high-k dielectric material. The method further includes providing a passivation layer on the deep trench filled with the metal material and the high-k dielectric material.

18 Claims, 9 Drawing Sheets

Related U.S. Application Data continuation of application No. 15/000,563, filed on Jan. 19, 2016, now Pat. No. 9,583,497, which is a continuation of application No. 14/467,580, filed on Aug. 25, 2014, now Pat. No. 9,287,272, which is a division of application No. 13/153,538, filed on Jun. 6, 2011, now Pat. No. 8,846,470.

(51) Int. Cl.
| | | |
|---|---|---|
| *H01L 21/74* | (2006.01) | |
| *H01L 21/762* | (2006.01) | |
| *H01L 29/66* | (2006.01) | |
| *H01L 27/12* | (2006.01) | |
| *H01L 29/06* | (2006.01) | |
| *H01L 27/06* | (2006.01) | |

(52) U.S. Cl.
CPC ........ *H01L 27/108* (2013.01); *H01L 27/1087* (2013.01); *H01L 27/1203* (2013.01); *H01L 28/60* (2013.01); *H01L 28/92* (2013.01); *H01L 29/0649* (2013.01); *H01L 29/66181* (2013.01); *H01L 27/0629* (2013.01)

(58) Field of Classification Search
CPC . H01L 21/76283; H01L 21/743; H01L 28/92; H01L 29/66181; H01L 27/0629
See application file for complete search history.

(56) References Cited

U.S. PATENT DOCUMENTS

| | | |
|---|---|---|
| 6,194,755 B1 | 2/2001 | Gambino et al. |
| 6,319,788 B1 | 11/2001 | Gruening et al. |
| 6,563,160 B2 | 5/2003 | Clevenger et al. |
| 6,664,154 B1 | 12/2003 | Bell et al. |
| 6,664,161 B2 | 12/2003 | Chudzik et al. |
| 6,962,845 B2 | 11/2005 | Lee |
| 7,094,659 B2 | 8/2006 | Chen et al. |
| 7,141,846 B2 | 11/2006 | Katsumata |
| 7,271,056 B2 | 9/2007 | Su |
| 7,416,937 B2 | 8/2008 | Koh |
| 7,560,356 B2 | 7/2009 | Lee |
| 7,615,816 B2 | 11/2009 | Cheng et al. |
| 7,622,778 B2 | 11/2009 | Lee et al. |
| 7,671,394 B2 | 3/2010 | Booth, Jr. et al. |
| 7,741,188 B2 | 6/2010 | Dyer et al. |
| 7,808,028 B2 | 10/2010 | Cheng |
| 7,875,919 B2 | 1/2011 | Booth, Jr. et al. |
| 7,888,723 B2 | 2/2011 | Brodsky et al. |
| 8,350,359 B2 | 1/2013 | Petrarca et al. |
| 9,287,272 B2 | 3/2016 | Booth et al. |
| 9,583,497 B2 | 2/2017 | Booth et al. |
| 2003/0215984 A1 | 11/2003 | Pogge et al. |
| 2006/0141701 A1 | 6/2006 | Saida et al. |
| 2009/0250738 A1 | 10/2009 | Dyer |
| 2010/0032742 A1 | 2/2010 | Barth et al. |
| 2011/0006390 A1 | 1/2011 | Huang et al. |

METAL TRENCH CAPACITOR AND IMPROVED ISOLATION AND METHODS OF MANUFACTURE

FIELD OF THE INVENTION

The present invention relates to semiconductor structures and methods of manufacture and, more particularly, to high-k dielectric metal trench capacitors and improved isolation and methods of manufacturing the same.

BACKGROUND

Capacitance enhancement is critical for continued scaling of trench embedded DRAM (eDRAM). In conventional trench eDRAM flow, trench capacitors are formed before CMOS logic processes. Although using high-k as the capacitor dielectric is known to enhance trench capacitance, the high thermal budget of CMOS process (e.g., STI anneal) poses constraints on the use of high-k materials that can be used in conventional trench eDRAM technology.

For example, forming a buried plate while protecting BOX is a challenge when a SOI substrate is used to manufacture eDRAM. Although the SOI substrate below the BOX can be pre-doped during SOI substrate fabrication, such an approach results in a nonconventional SOI substrate which, in turn, causes integration challenges when eDRAM and logic are formed on such a customized SOI substrate.

Accordingly, there exists a need in the art to overcome the deficiencies and limitations described hereinabove.

SUMMARY

In a first aspect of the invention, a method comprises forming at least one deep trench in a substrate, and filling the deep trench with sacrificial fill material. The method further comprises forming a strap. The method further comprises continuing with CMOS processes, comprising forming at least one transistor and back end of line (BEOL) layer. The method further comprises removing the sacrificial fill material from the deep trenches to expose sidewalls and a strap, and forming a capacitor plate on the exposed sidewalls of the deep trench. The method further comprises lining the capacitor plate with a high-k dielectric material and filling remaining portions of the deep trench with a metal material, over the high-k dielectric material and in contact with the strap. The method further comprises providing a passivation layer on the deep trench filled with the metal material and the high-k dielectric material.

In another aspect of the invention, a method comprises forming a deep trench in a substrate. The method further comprises partially filling the deep trench with a sacrificial fill material. The method further comprises partially filling the deep trench with a poly material. The method further comprises recessing the poly material to form a poly strap. The method further comprises continuing with CMOS processes including forming transistors and BEOL devices in at least one BEOL layer. The method further comprises bonding a carrier wafer to a last of the at least one BEOL layer. The method further comprises removing the sacrificial material from the deep trench to expose sidewalls. The method further comprises ion implanting or plasma doping the exposed sidewalls, followed by a laser anneal process, to form a capacitor plate from the exposed sidewall. The method further comprises forming a high-k dielectric material on the capacitor plate by a deposition process. The method further comprises forming a metal sidewall on the high-k dielectric material. The method further comprises filling in remaining portions of the deep trench with conductive material contacting the high-k dielectric material. The method further comprises recessing the conductive material. The method further comprises providing a passivation layer on the deep trench structure, over the conductive material.

In yet another aspect of the invention, a structure comprises a deep trench lined with a high-k dielectric material formed on a capacitor plate formed from sidewalls of the deep trench. The structure further comprises a metal sidewall on the high-k dielectric material. The structure further comprises a conductive material contacting the metal sidewall and an underlying poly strap. The structure further comprises CMOS devices and BEOL structures on the substrate. The structure further comprises a passivation layer on the deep trench filled with the metal material and the high-k dielectric material.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of a capacitor structure which comprises the structures of the present invention. In still further embodiments, a method in a computer-aided design system is provided for generating a functional design model of the capacitor structure. The method comprises generating a functional representation of the structural elements of the interconnect structure.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The present invention relates to semiconductor structures and methods of manufacture and, more particularly, to high-k dielectric metal trench capacitors and improved isolation and methods of manufacturing the same. More specifically, the present invention comprises improved trench eDRAMs and methods of manufacturing the same. Advantageously, the present invention enables the use of a higher-k node dielectric in the deep trench, which enhances trench capacitance. The present invention also eases integration challenges when, for example, bottling occurs, or during the forming of the buried plate. Moreover, the present invention is compatible with 3D integration schemes, and enables cost-effective deep trench isolation.

In embodiments, the trench eDRAM is formed by pre-filling a deep trench with a dummy material (sacrificial fill material) and then continuing with formation of eDRAM and CMOS processes. Upon completion of the eDRAM and CMOS processes, the wafer is bonded to a wafer carrier or another wafer (e.g., in 3D integration technology), and the dummy material is removed from the deep trench. The trench is then implanted or doped to form the capacitor plate, followed by a deposition of a high-k material, which can be used for the node dielectric. The use of a high-k material is possible since all high thermal budget processes have been performed, prior to the deposition of the high-k material. Optionally, a portion of the deep trench can be widened (after removing the dummy material) to further enhance trench capacitance. In additional embodiments, the buried plate can be formed after the trench is widened, if not previously performed during earlier stages of the process.

Figure 1:
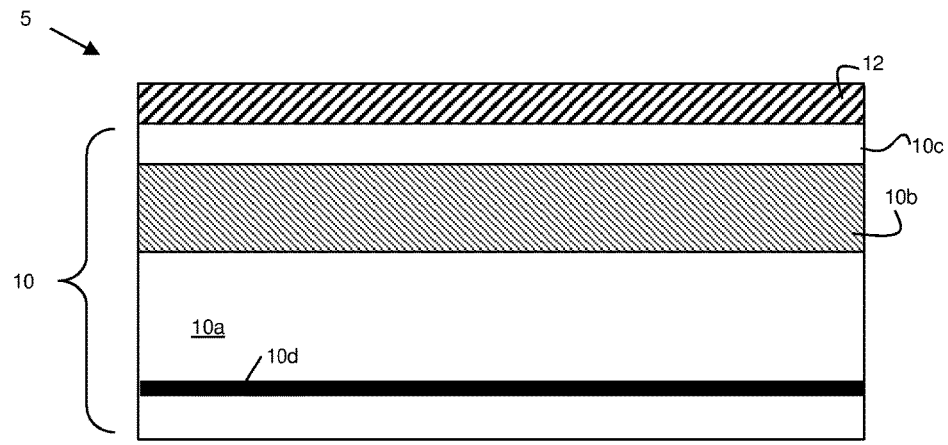
FIGS. 1-11 show processing steps and respective structures in accordance with aspects of the invention.

FIGS. 1-11 show processing steps and respective structures in accordance with aspects of the invention. Specifically, FIG. 1 shows a starting structure 5. The starting structure 5 includes a wafer 10, which is representative of a BULK substrate or Silicon-On-Insular (SOI) implementation, in accordance with aspects of the present invention. In the BULK implementation, the layers 10a and 10b may be eliminated, using only the layer 10c; whereas, in the SOI implementation, the layer 10c is formed on layers 10a and 10b. In embodiments, the layer 10c is a semiconductor layer (e.g., silicon), which can comprise various semiconductor materials, such as, for example, Si, SiGe, SiC, SiGeC, or other III-V materials, etc.; although other materials are also contemplated by the present invention based on the desired end use application of the semiconductor device.

In the SOI implementation, the semiconductor layer 10c is formed on an insulation layer 10b which, in turn, is formed on a semiconductor layer 10a. The insulator layer 10b is referred to as a BOX in the SOI implementation, and has a thickness of about, for example, 140 nm; although other dimensions are also contemplated by the present invention. The insulation layer 10b, e.g., BOX, may be composed of oxide, nitride, oxynitride, or any other suitable insulating materials, or any suitable combination of those materials. In one embodiment, the insulation layer 10b is composed of $SiO_2$. The semiconductor layer 10c, in the SOI implementation, can have a thickness of about 5 to 100 nm; although other dimensions are also contemplated by the present invention. In the SOI implementation, the layer 10a can be doped with dopants (below the BOX layer 10b) to form a buried plate for subsequent capacitor formation. Hereinafter, the layers will be discussed in terms of the wafer 10, unless otherwise specified herein.

A pad layer 12 is formed on the wafer 10 and more specifically, on the semiconductor layer 10c. In embodiments, the pad layer 12 can be a nitride layer which is formed using conventional chemical vapor deposition (CVD) processes. In further embodiments, an oxide layer can be formed under the nitride layer, to form the pad layer 12.

Still referring to FIG. 1, in embodiments, an optional marker layer 10d can be formed within the wafer 10 to facilitate subsequent processes, e.g., formation of a deep trench. In either the BULK implementation or the SOI implementation, the marker layer 10d can be formed in the wafer 10 using, for example, an epitaxial growth process or an implantation process. In embodiments, the optional marker layer 10d is formed of a different material, e.g., SiGe, than the wafer 10, and may be about 50 nm thick; although other dimensions are also contemplated by the present invention. The depth of the optional marker layer 10d can vary, e.g., about 3-5 microns from a top surface of the wafer 10; although other dimensions are also contemplated by the present invention.

Figure 2:
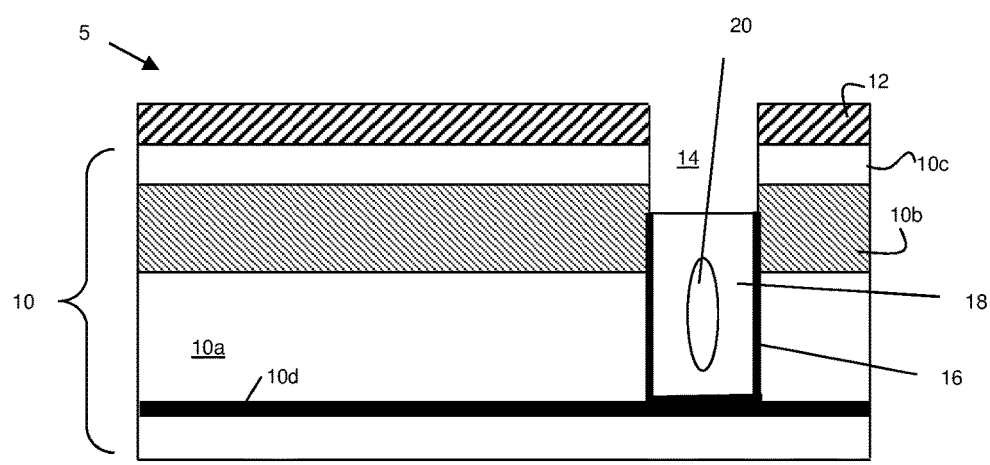

As shown in FIG. 2, a deep trench 14 is formed in the structure 5. In embodiments, the deep trench 14 extends to the marker layer 10d, and can be formed using conventional lithographic and etching processes. For example, a resist can be formed on the pad layer 12, and exposed to light to form a pattern (opening). A reactive ion etching (RIE) is then performed to form the deep trench 14. A hardmask (e.g., oxide) can be deposited on top of the pad layer 12 before applying the resist to further facilitate the formation of the deep trench 14. The deep trench 14 can be etched, stopping on the marker layer 10d. In embodiments, the resist and the hardmask, when used, can be removed by a conventional ashing and/or etching processing, known to those of skill in the art.

A sacrificial fill material 18 is formed in the deep trench 14. The sacrificial fill material 18 can be, for example, an amorphous carbon or an oxide. The sacrificial fill material 18 can be formed in the deep trench 14 by a conventional deposition process such as, for example, a conformal deposition process, e.g., chemical vapor deposition (CVD). Depending on the conformality of the deposition process, a void 20 may be formed within the deep trench 14 due to a pinch off phenomena, for example, when a non-conformal deposition process is used.

In embodiments, the sacrificial fill material 18 fills the deep trench 14 to a predetermined height. For example, in one exemplary non-limiting illustration, the deposition of the sacrificial fill material 18 continues until a top surface of the sacrificial fill material 18 reaches any portion of the of the BOX layer 10b. Preferably, the top surface of the sacrificial material 18 remains below the top surface of the BOX layer 10b. In the BULK implementation and in the SOI implementation, the sacrificial fill material 18 can fill the deep trench 14 to predetermined height, e.g., leaving an upper portion, e.g., about a 50 nm portion of the deep trench 14, unfilled with the sacrificial fill material 18.

In embodiments, an optional liner 16 can be deposited in the deep trench 14, prior to the formation of the sacrificial fill material 18. More specifically, in the BULK implementation, a liner 16 is deposited in the trench, to form a collar around the substrate. The optional liner 16 can be, for example, oxide or nitride, which will protect the wafer 10 during subsequent processes.

Figure 3:
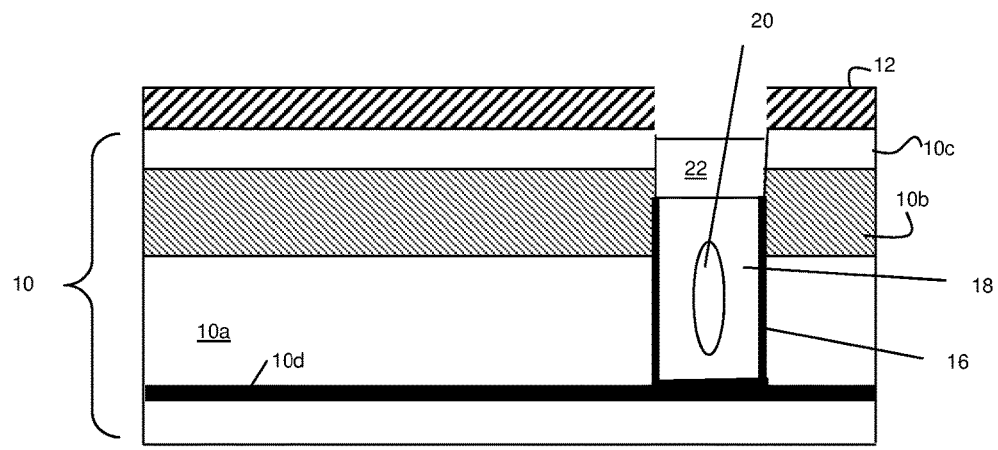

In FIG. 3, a polysilicon layer or any other suitable conductive material is deposited in the deep trench 14 to form a strap 22. The strap, e.g., polysilicon layer 22, can undergo an etching process to form a recess 14 in the deep trench. In embodiments, the recess is about 20 nm to 40 nm below the surface of the wafer 10; although other dimensions are contemplated by the present invention. The polysilicon layer 22 can be deposited using conventional deposition processes such as, for example, low pressure CVD (LPCVD). Preferably, the polysilicon layer 22 is doped with dopants such as arsenic, phosphorus, or boron. The dopants can be incorporated into the polysilicon layer 22 either by in-situ doping (during polysilicon deposition) or by ex-situ doping (implantation after deposition).

Figure 4:
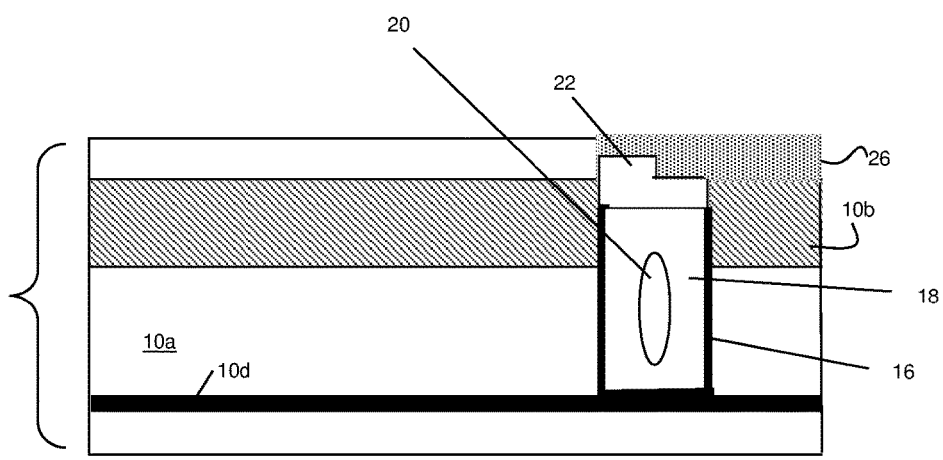

In FIG. 4, a patterned resist is formed on the pad layer 12 and wafer 10, e.g., semiconductor layer 10c in an SOI implementation, and overlapping the poly strap 22. A portion of unprotected pad layer 12 and semiconductor layer 10c is then removed using, for example, a conventional etching process such as, e.g., RIE. This conventional etching process also removes a portion of the polysilicon layer 22 and BOX 10*b*, which is not protected by the resist. As a result, a trench is formed, with a stepped pattern of the polysilicon layer 22. In the BULK implementation, a portion of the semiconductor layer 10*c* is removed using a conventional etching process. The resist can then be removed using a conventional ashing process.

Still referring to FIG. 4, an insulator material is formed in the trench structure to form a shallow trench isolation (STI) structure 26. In embodiments, the insulator material is oxide which can be deposited using a conventional deposition process. It should be understood, though, that other insulator materials are also contemplated by the present invention. In embodiments, the depth of the STI structure 26 is about 200 nm to about 300 nm; although, other depths are also contemplated by the present invention. In embodiments, the depth of the STI structure 26 may exceed the original thickness of the semiconductor layer 10*c*, in the SOI implementation. The insulator material can then undergo a polishing process in order to planarize the structure. The pad layer can then be removed using conventional etchants.

Figure 5:
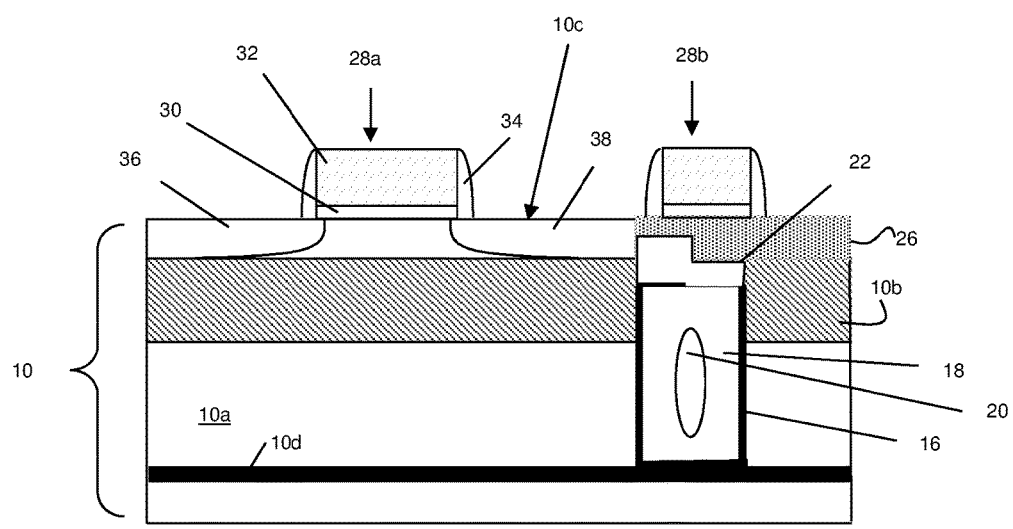

In FIG. 5, an access transistor 28*a* and a pass gate transistor 28*b* are formed on the surface of the substrate, e.g., semiconductor layer 10*c*, and STI structure 26, respectively. In particular, a dielectric layer 30 is blanket deposited on the surface of the structure, i.e., semiconductor layer 10*c* and STI structure 26. The dielectric layer 30 can be, for example, any high-k material such as, for example, a hafnium based material. The dielectric layer 30 can also be, for example, a nitride or $SiO_2$, although other materials are also contemplated by the present invention. A gate material 32 is then blanket deposited on the dielectric layer 30. For example, the dielectric material 32 can be a poly material, a gate metal or a combination of both. The dielectric layer 30 and gate material 32 are then patterned using a conventional lithographic process. A spacer or sidewall 34 is formed (deposited) on the patterned gate structure using, for example, nitride or oxide. In embodiments, the pass gate transistor 28*b* is formed, at least partially, on the STI structure 26, aligned with the deep trench and more specifically with the poly strap 22. A source region 36 and a drain region 38 are formed, e.g., ion implantation or doped, in conventional processes, in the semiconductor layer 10*c*, on sides of the access transistor 28*a*. The source region 36 and the drain region 38 can be activated by undergoing an anneal process.

Figure 6:
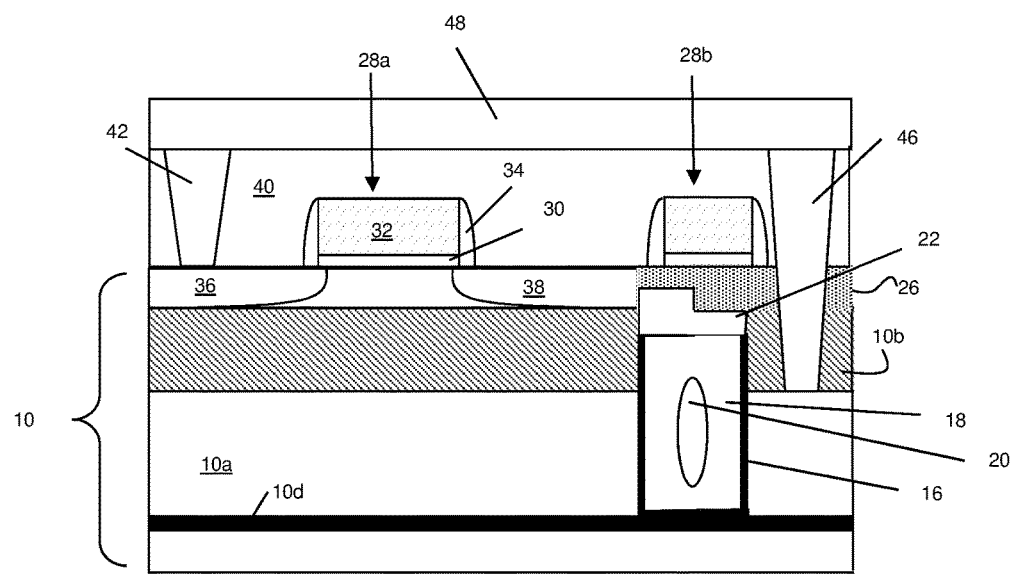

In FIG. 6, back end of the line (BEOL) structures are formed in accordance with aspects of the present invention. For example, an insulator layer 40 is deposited on the surface of the structure, embedding the access transistor 28*a* and the pass gate transistor 28*b*. Contacts 42 and 46 are formed in the insulator layer 40, using conventional lithography processes. For the contact 42, a trench is formed to the source 36 and filled with a conductive material such as, for example, tungsten or copper. For the contact 46, a trench is formed into the underlying wafer 10; that is, the trench is formed through the STI structure 26, on the side of the pass gate transistor 28*b*. In an SOI implementation, the trench is formed through the BOX layer 10*b* and into the underlying layer 10*a*. The trench is then filled with a metal material such as, for example, tungsten or copper. BEOL devices 48 such as, for example, transistors, capacitors, resistors, etc. are formed in contact with the contacts 42 and 46, to interconnect with structures on the wafer 10.

Figure 7:
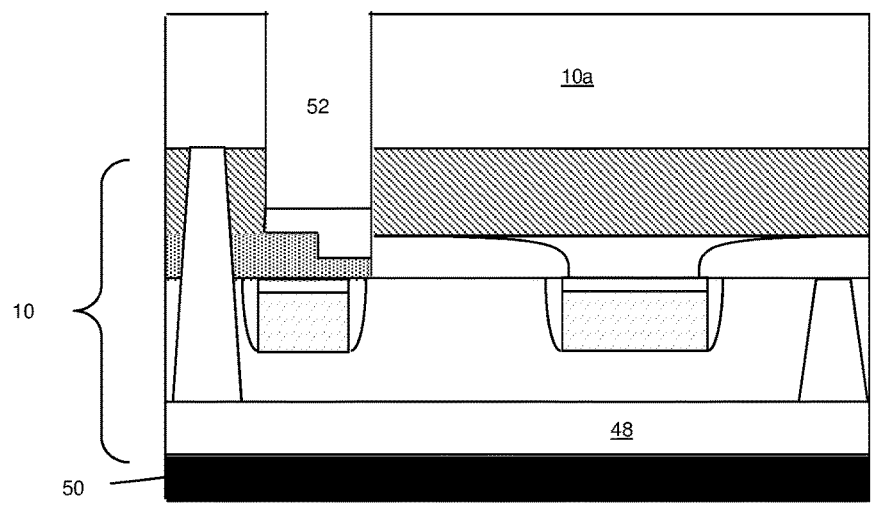

In FIG. 7, the structure is turned upside down and bonded to, for example, a wafer carrier or another wafer 50. More specifically, the wafer carrier or another wafer 50 is bonded to the BEOL layer 48. A portion of the exposed backside of the wafer 10 can be removed, for example, by grinding, etching and/or polishing. The marker layer, if present, can be used as a stopping layer. The optional marker layer can then be removed using, for example, a selective chemistry. For example, the selective chemistry can be an ammonia wet etch or a gas phase HCl. The sacrificial fill material is removed from the deep trench to form trench 52 using, for example, a selective chemistry that will not attack the underlying strap 22. In embodiments wherein amorphous carbon is used as the sacrificial fill material, an oxygen ashing process can be used to selectively remove amorphous carbon. In BULK implementations, the optional liner 16 will protect the wafer 10 during the removal of the sacrificial fill material. That is, the option liner 16 will prevent compromise of the underlying materials during the removal process. The optional liner 16 can then be stripped, after removal of the sacrificial fill material.

Figure 8:
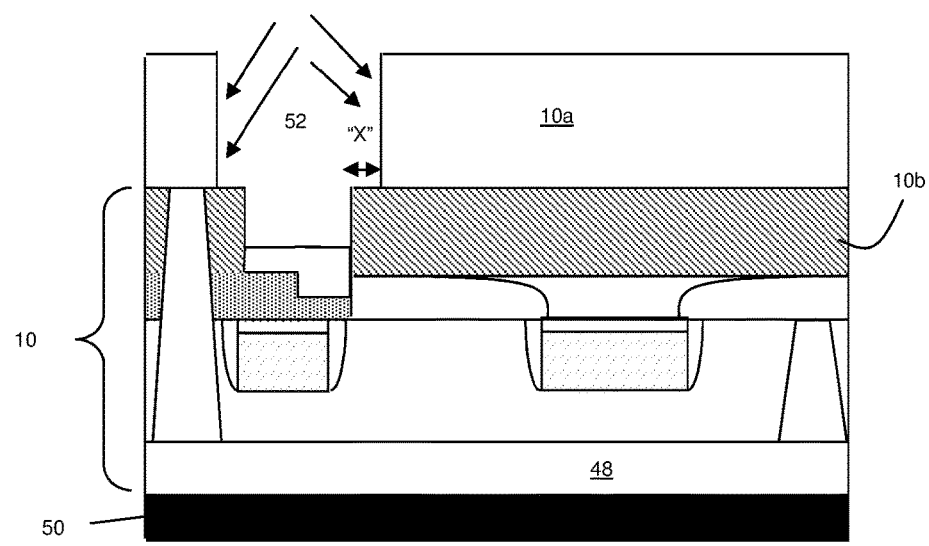

In FIG. 8, the trench 52 can be widened, above the BOX layer 10*b* or to a certain depth in the BULK implementation. In embodiments, the trench 52 can be widened to about 10 nm to 20 nm on each side, or about 20 nm to 40 nm about a circumference, in the case that the trench 52 has a circular cross section. This widened portion is represented by "X", in FIG. 8. The widening of the trench 52 can be performed by, for example, an aqueous etch solution containing Tetramethylammonium hydroxide (TMAH) or ammonium hydroxide, or a dry etch process such as chemical dry etch.

To form the capacitor plate, the sidewalls of the trench 52, e.g., wafer 10, e.g., semiconductor layer 10*a*, undergo an ion implantation or plasma doping, followed by a laser anneal process. These processes are represented by the arrows in FIG. 8. The ion implantation or doping can comprise phosphorous, arsenic, boron or indium, to name a few doping materials, at an angle and energy that does not penetrate entirely through the BOX layer or other insulator layer 10*b*. The BOX layer or other insulator layer 10*b* will protect the remaining structures, e.g., BEOL, transistors, etc. during this implantation or doping process. In embodiments, the energy level can be, for example, 30 Kev and the angle implant will be determined based on the etch back ratio of the opening of the trench 52. By way of one non-limiting example, the angle can be about 2 degrees to 5 degrees, with a trench 52 of about 100 nm wide and 3 microns deep.

Figure 9:
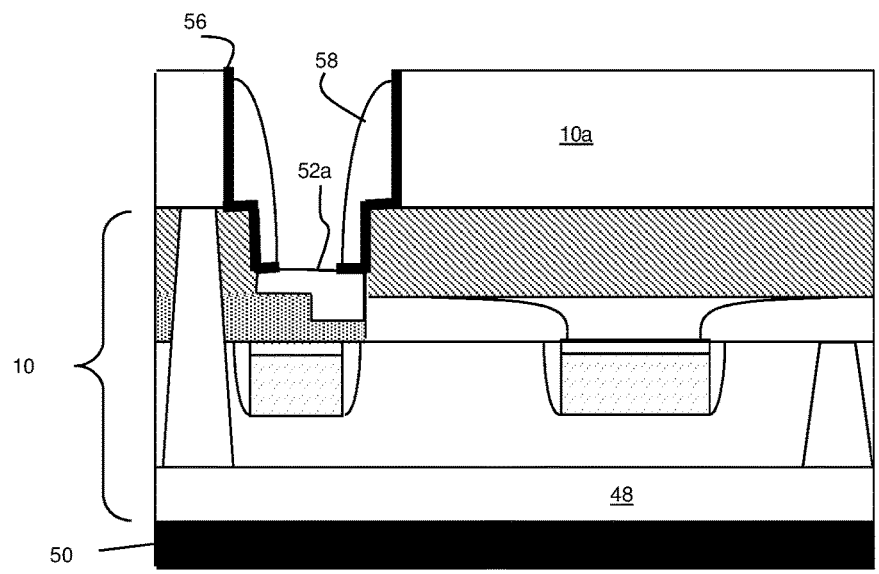

In FIG. 9, the trench 52 is lined with a high-k-material 56 such as, for example, $HfO_2$ or $ZrO_2$. The high-k material 56 can be conformally deposited using, for example, an atomic layer deposition (ALD) process, to a thickness of about 3 nm to about 10 nm; although other dimensions are also contemplated by the present invention. In embodiments, an interfacial layer may be formed between the high-k material 56 and the layer 10*a* such as, for example, an $SiO_2$ layer formed by a chemical oxidation process of the wafer 10. (The interfacial material and the high-k material are both represented by reference numeral 56.) A metal 58 is deposited in the trench 52. The metal 58 can be, for example, titanium nitride (TiN), tungsten or other conductive material that can form a capacitor plate. The metal 58 then undergoes an anisotropic process such as reactive ion etch (RIE) to form sidewalls on the semiconductor layer. The metal RIE process exposes the high-k material 56 at the bottom of the trench 52*a*, which can then be removed using a high-k RIE process.

Figure 10:
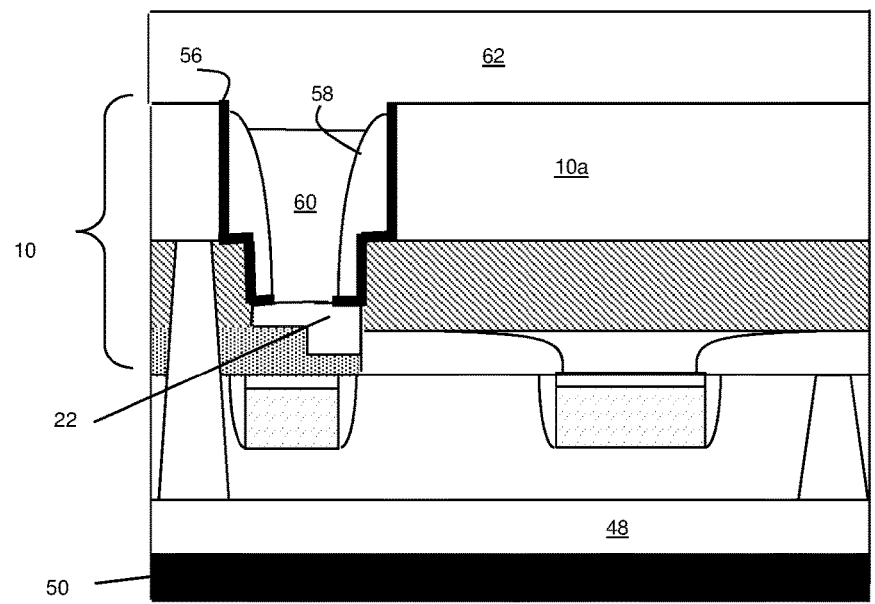
Figure 11:
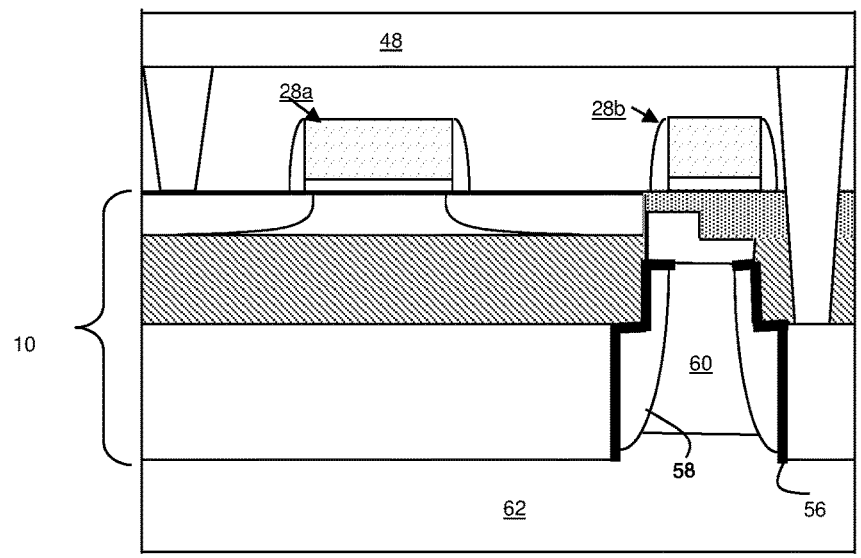

In FIG. 10, the trench is filled with a metal 60, contacting both the metal sidewalls 58 and the underlying poly strap 22. The metal 60 can be, for example, TiN or tungsten, to name a few conductive materials. The metal 60 can be slightly recessed, to slightly below the surface of the capacitor plate, e.g., doped or ion implanted semiconductor layer. A final passivation layer 62 is deposited on the metal 60 and exposed portions of the doped or ion implanted semiconductor layer. The final passivation layer 62 may be, for example, an oxide or nitride material. In FIG. 11, the wafer handler is removed, and the remaining portion of the structure is turned right side up.

FIGS. 12-15 show an additional embodiment in accordance with aspects of the present invention. More specifically, FIGS. 12-15 show processing steps and respective structures in which the sacrificial fill material is formed in a deep trench in both eDRAM area and logic areas. In this implementation, a block mask is used to protect the sacrificial fill material in a deep trench in the logic area, while the sacrificial fill material is replaced by high-k/metal fill in the eDRAM area. The deep trenches with the sacrificial fill material, in the logic area, serve as deep trench isolation to improve the isolation between the eDRAM and logic areas and to improve well isolation in the logic area.

Figure 12:
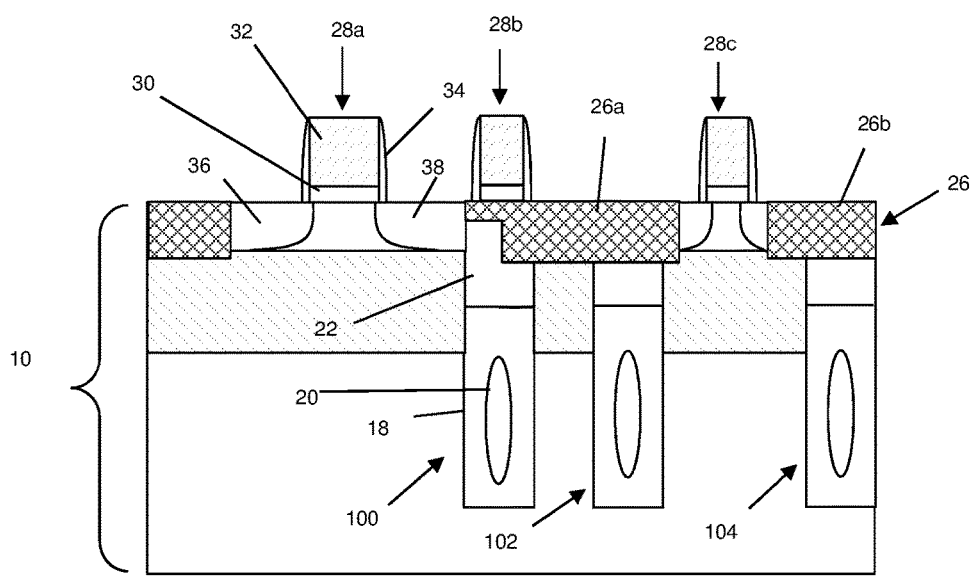
FIGS. 12-15 show processing steps and respective structures in accordance with additional aspects of the invention.

More specifically, FIG. 12 shows an eDRAM access transistor 28a and a pass gate 28b, which form an eDRAM. The structure of FIG. 12 also shows a logic transistor 28c. A deep trench 100 is formed under the pass gate 28b, which includes the poly strap 22 (with stepped portion due to etching processes) and the sacrificial fill material 18 (with a void 20, in embodiments). A deep trench 102 is formed under the pass gate 28b, on a side of the deep trench 100. The deep trench 102 is isolated from the pass gate 28b by the STI structure 26a. A deep trench 104 is formed in the wafer 10 (e.g., layer 10a (and layer 10b)) on the side of the logic transistor 28c, separated from the deep trench 102 by the channel region of the logic transistor 28c. The deep trenches 100, 102 and 104 are formed simultaneously using etching and deposition processes in a similar manner described above.

In embodiments, after the formation of the deep trenches 100, 102, 104, the STI structures 26 (e.g., 26a and 26b) are formed by etching and deposition processes, in the manner described above. The eDRAM access transistor 28a, the pass gate 28b, and the logic transistor 28c are simultaneously or separately formed by, for example, deposition of the dielectric material 30 and gate material 32, and patterning thereof. The eDRAM transistors 28a and the logic transistor 28c may have the same or different gate dielectric material and gate material. Sidewall spacers 34 are deposited on the patterned gate structures.

Figure 13:
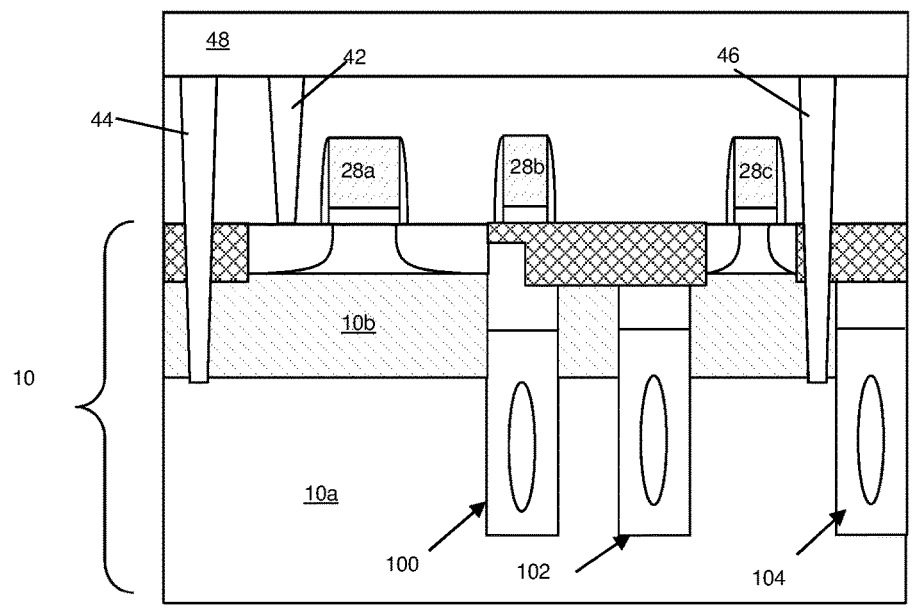

FIG. 13 shows the formation of back end of the line (BEOL) structures in accordance with aspects of the present invention. For example, an insulator layer 40 is deposited on the surface of the structure, embedding the eDRAM access transistor 28a, the pass gate 28b, and the logic transistor 28c. Contacts 42, 44 and 46 are formed in the insulator layer 40, using conventional lithography processes as described above. For the contact 42, a trench is formed to the source 36 and filled with a metal material such as, for example, tungsten or copper. For the contacts 44 and 46, a trench is formed into the underlying wafer 10; that is, the trench is formed through the STI structure 26. In an SOI implementation, the trench is formed through the BOX layer 10b and to the underlying layer 10a. The trench is then filled with a metal material such as, for example, tungsten or copper. BEOL layer 48 such as, for example, transistors, capacitors, resistors, etc. are formed in contact with the contacts 42, 44 and 46, to interconnect with structures on the wafer 10.

Figure 14:
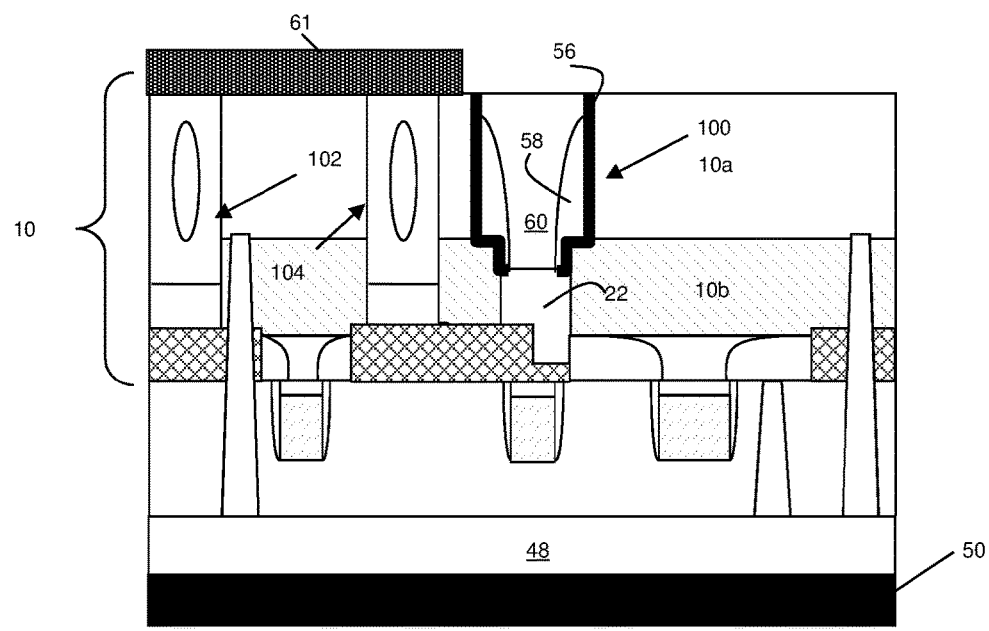

In FIG. 14, the structure is turned upside down and bonded to, for example, a wafer carrier or another wafer 50. More specifically, the wafer carrier or another wafer 50 is bonded to the BEOL layer 48. A portion of the exposed backside of the wafer 10 can be removed, for example, by grinding, etching and/or polishing. The marker layer, if present, can be used as a stopping layer. The optional marker layer can then be removed using, for example, a selective chemistry as describe above. A hardmask 61 is formed over the trenches 102, 104, leaving the trench 100 exposed for additional processing. The sacrificial fill material is removed from the deep trench 100 to form a capacitor trench using, for example, a selective chemistry that will not attack the underlying poly material 22. In embodiments, an $O_2$ ashing process selective to carbon can be used to remove the sacrificial fill material. In BULK implementations, the optional liner will protect the wafer 10 during the removal of the sacrificial fill material.

In optional embodiments, the capacitor trench can be widened, above the BOX layer 10b or to a certain depth in the BULK implementation. In embodiments, the trench can be widened to about 10 nm to 20 nm on each side, or about 20 nm to 40 nm about a circumference, in the case that the trench has a circular cross section. The widening of the trench can be performed by, for example, an aqueous etch solution containing TMAH or ammonium hydroxide, or a dry etch process such as chemical dry etch.

To form the capacitor plate, the sidewalls of the capacitor trench undergo an ion implantation or plasma doping, followed by a laser anneal process (similar to that shown in FIG. 8). The ion implantation or doping can comprise phosphorous, arsenic, boron or indium, to name a few doping materials, at an angle and energy that does not penetrate entirely through the BOX layer or other insulator layer 10b. The BOX layer or other insulator layer 10b will protect the remaining structures, e.g., BEOL, transistors, etc. during this implantation or doping process. In embodiments, the energy level can be, for example, 30 Kev and the angle implant will be determined based on the etch back ratio of the opening of the trench 52. By way of one non-limiting example, the angle can be about 2 degrees to 5 degrees, with a trench 52 of about 100 nm wide and 3 microns deep. The hardmask 61 will protect the deep trenches 102 and 104 during these processes.

The trench is lined with a high-k-material 56 such as, for example, $HfO_2$ or $ZrO_2$. The high-k material 56 can be conformally deposited using, for example, an atomic layer deposition (ALD) process, to a thickness of about 3 nm to about 10 nm; although other dimensions are also contemplated by the present invention. As described above, in embodiments, an interfacial layer may be formed between the high-k material 56 and the layer 10a such as, for example, an $SiO_2$ layer formed by a chemical oxidation process of the wafer 10. (The interfacial material and the high-k material are both represented by reference numeral 56.) A metal 58 is deposited in the trench, which can be, for example, TiN, tungsten or other conductive material that can form a capacitor plate. The metal 58 then undergoes an anisotropic process such as reactive ion etch (RIE) to form sidewalls on the semiconductor layer. The metal RIE process exposes the high-k material 56 at the bottom of the trench, which can then be removed using a high-k RIE process.

The trench is filled with a metal 60, contacting both the metal sidewalls 58 and the underlying poly strap 22. The metal 60 can be, for example, TiN or tungsten, to name a few conductive materials. The metal 60 can be slightly recessed, to slightly below the surface of the capacitor plate, e.g., doped or ion implanted semiconductor layer.

Figure 15:
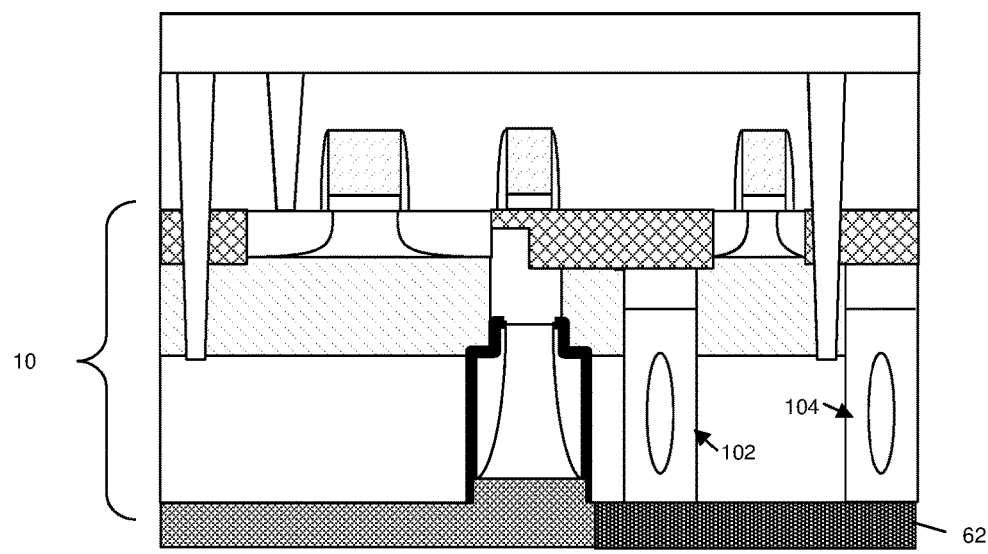

In FIG. 15, a final passivation layer 62 is deposited on the metal 60 and exposed portions of the doped or ion implanted semiconductor layer 10a. The final passivation layer 62 may be, for example, an oxide or nitride material. The wafer handler is removed, and the remaining portion of the structure is turned right side up.

Figure 16:
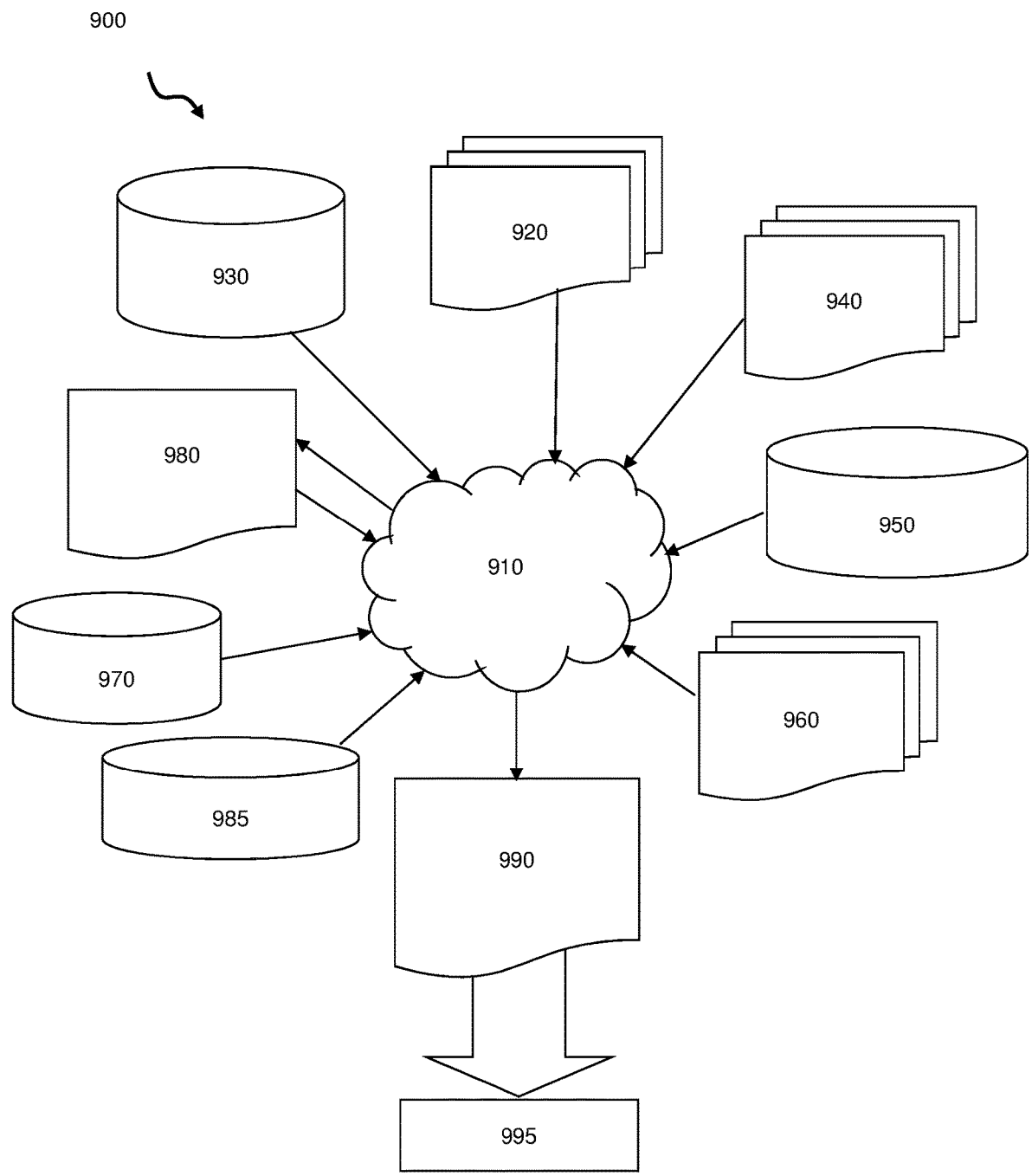
FIG. 16 is a flow diagram of a design process used in semiconductor design, manufacture, and/or test.

FIG. 16 is a flow diagram of a design process used in semiconductor design, manufacture, and/or test. FIG. 16 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-15. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 16 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-15. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-15 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-15. In one embodiment, design structure 990 may comprise a compiled, executable HDL simulation model that functionally simulates the devices shown in FIGS. 1-15.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-15. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

The invention claimed is:

1. A structure, comprising:
   a deep trench;
   a metal sidewall on the deep trench;
   a conductive material formed in the deep trench and contacting the metal sidewall;
   a passivation layer directly on a first surface of the conductive material,
   a poly strap directly on a second surface of the conductive material on an opposite side of the conductive material from the passivation layer; and
   a transistor having a gate structure formed over the poly strap and aligned with the deep trench and the poly strap,
   wherein the passivation layer is in direct contact with the conductive material, and
   wherein the poly strap is formed between the conductive material and the gate structure of the transistor.

2. The structure of claim 1, further comprising a shallow trench isolation layer (STI) formed between the poly strap and the gate structure of the transistor.

3. The structure of claim 1, wherein the deep trench extends to an underlying marker layer, which is formed in a substrate.

4. The structure of claim 3, wherein the marker layer is composed of material that is different than the substrate.

5. The structure of claim 4, wherein the conductive material is one of TiN and Tungsten.

6. The structure of claim 1, wherein the poly strap is a recessed poly strap.

7. The structure of claim 6, wherein the passivation layer is one of an oxide material and nitride material.

8. The structure of claim 7, further comprising an insulation layer deposited on a surface of the structure.

9. The structure of claim 8, wherein the transistor is embedded within the insulation layer.

10. The structure of claim 9, wherein at least one contact is embedded within the insulation layer.

11. The structure of claim 10, further comprising a wafer bonded to the insulation layer.

12. The structure of claim 1, wherein the poly strap includes a stepped feature.

13. The structure of claim 1, further comprising a back end of the line (BEOL) layer.

14. The structure of claim 1, wherein the deep trench includes a stepped feature.

15. The structure of claim 1, wherein the passivation layer is continuous over the deep trench.

16. The structure of claim 1, wherein the passivation layer is in direct contact with a substrate.

17. The structure of claim 16, wherein the deep trench is formed in a first surface of the substrate, and the passivation layer is directly over the first surface of the substrate and over the deep trench.

18. The structure of claim 2, wherein the STI is aligned with the poly strap, the conductive material and the gate structure.

* * * * *